(12) United States Patent
Cho et al.

(10) Patent No.: US 11,644,931 B2
(45) Date of Patent: *May 9, 2023

(54) TOUCH PANEL AND METHOD OF MANUFACTURING THE SAME

(71) Applicant: Samsung Display Co., Ltd., Yongin-si (KR)

(72) Inventors: Ki Hyun Cho, Suwon-si (KR); Cheol Kyu Kim, Seoul (KR); Sung kyun Park, Suwon-si (KR); Sun Haeng Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/718,646

(22) Filed: Apr. 12, 2022

(65) Prior Publication Data

US 2022/0236829 A1 Jul. 28, 2022

Related U.S. Application Data

(60) Continuation of application No. 15/957,839, filed on Apr. 19, 2018, now Pat. No. 11,307,721, which is a (Continued)

(30) Foreign Application Priority Data

Dec. 2, 2014 (KR) .................. 10-2014-0170610

(51) Int. Cl.
*G06F 3/044* (2006.01)
*G06F 3/041* (2006.01)
(Continued)

(52) U.S. Cl.
CPC ............ *G06F 3/0443* (2019.05); *G06F 3/041* (2013.01); *H05K 3/064* (2013.01); *H05K 3/10* (2013.01);
(Continued)

(58) Field of Classification Search
None
See application file for complete search history.

(56) References Cited

U.S. PATENT DOCUMENTS 7,190,008 B2 3/2007 Amudson et al.
8,568,599 B1 10/2013 Yu et al.
(Continued)

FOREIGN PATENT DOCUMENTS

JP 2012-164648 A 8/2012
KR 2010-0067236 A 6/2010
(Continued)

*Primary Examiner* — Fred Tzeng
(74) *Attorney, Agent, or Firm* — Innovation Counsel LLP

(57) ABSTRACT

A touch panel and a method of manufacturing the touch panel are provided. The touch panel includes a substrate comprising a wiring area and a sensor area, a sensing pattern located on a surface of the substrate in the sensor area, and a wiring line located on the surface of the substrate in the wiring area and electrically connected to the sensing pattern. The sensing pattern includes a plurality of first fine metal lines arranged irregularly in a mesh, and a first photosensitive layer pattern residue located between at least two of the first fine metal lines.

10 Claims, 8 Drawing Sheets

Related U.S. Application Data division of application No. 14/668,765, filed on Mar. 25, 2015, now Pat. No. 9,977,522.

(51) Int. Cl.
    *H05K 3/06*     (2006.01)
    *H05K 3/10*     (2006.01)
    *H01L 21/027*     (2006.01)

(52) U.S. Cl.
    CPC .............. *G06F 2203/04103* (2013.01); *G06F 2203/04112* (2013.01); *H01L 21/0272* (2013.01)

(56) References Cited

U.S. PATENT DOCUMENTS

| | | |
|---|---|---|
| 8,790,865 B2 | 7/2014 | Li et al. |
| 8,940,560 B2 | 1/2015 | Sun et al. |
| 8,994,680 B2 * | 3/2015 | Lai ........................ G06F 3/0412 345/173 |
| 9,011,703 B2 | 4/2015 | Baek |
| 2008/0158461 A1 | 7/2008 | Kenmochi et al. |
| 2008/0198143 A1 | 8/2008 | Kinoshita et al. |
| 2009/0283689 A1 | 11/2009 | Mochizuki et al. |
| 2010/0164921 A1 | 7/2010 | Ino et al. |
| 2010/0194721 A1 | 8/2010 | Miyata et al. |
| 2010/0233847 A1 | 9/2010 | Ohara et al. |
| 2010/0283717 A1 | 11/2010 | Oka et al. |
| 2011/0084268 A1 | 4/2011 | Yamazaki et al. |
| 2011/0157097 A1 | 6/2011 | Hamada et al. |
| 2011/0260741 A1 | 10/2011 | Weaver et al. |
| 2013/0106746 A1 | 5/2013 | Lai et al. |
| 2013/0146333 A1 | 6/2013 | Cheng |
| 2013/0207911 A1 | 8/2013 | Barton et al. |
| 2014/0152579 A1 | 6/2014 | Frey |
| 2014/0184934 A1 | 7/2014 | Park et al. |
| 2014/0354903 A1 | 12/2014 | Wang et al. |
| 2014/0375912 A1 | 12/2014 | Gotoh et al. |
| 2015/0022741 A1 | 1/2015 | Nii et al. |
| 2015/0109238 A1 | 4/2015 | Chen et al. |
| 2015/0185959 A1 * | 7/2015 | Chen ..................... G06F 3/0445 345/175 |
| 2016/0170541 A1 | 6/2016 | Iwami |
| 2017/0146905 A1 | 5/2017 | Aridomi et al. |
| 2017/0221196 A1 | 8/2017 | Yamaguchi et al. |
| 2017/0228090 A1 | 8/2017 | Nakamura |
| 2017/0243342 A1 | 8/2017 | Iwami |
| 2017/0244934 A1 * | 8/2017 | Chien ................. F21V 23/0407 |

FOREIGN PATENT DOCUMENTS

| | | |
|---|---|---|
| KR | 10-2013-0005093 A | 1/2013 |
| KR | 10-2013-0044058 A | 5/2013 |
| KR | 10-2013-0071721 A | 7/2013 |
| KR | 2014-0070104 A | 6/2014 |

\* cited by examiner

TOUCH PANEL AND METHOD OF MANUFACTURING THE SAME

This application is a continuation application of U.S. patent application Ser. No. 15/957,839 filed on Apr. 19, 2018, which is a divisional application of U.S. patent application Ser. No. 14/668,765 filed on Mar. 25, 2015, which claims priority from Korean Patent Application No. 10-2014-0170610 filed Dec. 2, 2014 in the Korean Intellectual Property Office, the disclosures of which are incorporated herein by reference in their entirety.

BACKGROUND

1. Technical Field

The present disclosure generally relates to a touch panel and a method of manufacturing the same.

2. Description of the Related Art

Touch panels are often used as input devices to liquid crystal displays (LCDs) and organic light-emitting displays (OLEDs). When a touch panel is used as an input device, a user can input commands to the touch panel using a hand or an object such as a pen. The touch panel can detect a touch position by sensing a change in capacitance or voltage between two electrodes, and provide a user command (corresponding to the touch position) to a display device.

Generally, a touch panel includes sensing electrodes and wiring lines connected to the sensing electrodes. The sensing electrodes are configured to sense the touch position of a hand or an object. In a conventional touch panel, the sensing electrodes are typically made of a transparent conductive material such as indium tin oxide (ITO). However, ITO has high surface resistance and may reduce the signal sensitivity and detection sensitivity of the touch panel.

SUMMARY

The present disclosure provides a touch panel having improved detection sensitivity and transmittance, and a method of manufacturing the touch panel.

According to an embodiment of the inventive concept, a touch panel is provided. The touch panel includes: a substrate comprising a wiring area and a sensor area; a sensing pattern located on a surface of the substrate in the sensor area; and a wiring line located on the surface of the substrate in the wiring area and electrically connected to the sensing pattern, wherein the sensing pattern comprises a plurality of first fine metal lines arranged irregularly in a mesh, and a first photosensitive layer pattern residue located between at least two of the first fine metal lines.

In some embodiments, the sensing pattern and the wiring line may be made of a same material.

In some embodiments, each of the sensing pattern and the wiring line may include any one of molybdenum (Mo), silver (Ag), titanium (Ti), aluminum (Al), copper (Cu), gold (Au), platinum (Pt), and nickel (Ni), or an alloy thereof.

In some embodiments, the first photosensitive layer pattern residue may be made of a positive photosensitive resin.

In some embodiments, the wiring line may include a plurality of second fine metal lines arranged irregularly in a mesh, and a second photosensitive layer pattern residue located between at least two of the second fine metal lines.

According to another embodiment of the inventive concept, a method of manufacturing a touch panel is provided. The method includes: providing a substrate comprising a wiring area, a sensor area, and a non-sensor area; forming a photosensitive layer pattern on a surface of the substrate, wherein the photosensitive layer pattern comprises a first pattern located in the sensor area and a second pattern located in the non-sensor area; forming gaps in the first pattern; forming a metal layer on the photosensitive layer pattern and the surface of the substrate; and forming a sensing pattern in the sensor area and a wiring line in the wiring area by removing the second pattern and a portion of the metal layer located on the second pattern.

In some embodiments, a first height measured from the surface of the substrate to a top surface of the first pattern may be less than a second height measured from the surface of the substrate to a top surface of the second pattern.

In some embodiments, forming the gaps in the first pattern may include drying the photosensitive layer pattern.

In some embodiments, drying the photosensitive layer pattern may include applying heat to the photosensitive layer pattern.

In some embodiments, forming the photosensitive layer pattern on the surface of the substrate may include: forming a photosensitive layer by coating a photosensitive resin on the surface of the substrate; and exposing and developing the photosensitive layer using a mask, wherein the mask may include a semi-transmitting mask pattern corresponding to the sensor area, a first mask pattern corresponding to the non-sensor area, and a second mask pattern corresponding to the wiring area.

In some embodiments, the photosensitive resin may be a positive photosensitive resin, the first mask pattern may be a light-blocking pattern, and the second mask pattern may be a light-transmitting pattern.

In some embodiments, the metal layer may include any one of molybdenum (Mo), silver (Ag), titanium (Ti), aluminum (Al), copper (Cu), gold (Au), platinum (Pt), and nickel (Ni), or an alloy thereof.

According to a further embodiment of the inventive concept, a method of manufacturing a touch panel is provided. The method includes: providing a substrate comprising a wiring area, a sensor area, and a non-sensor area; forming a photosensitive layer pattern on a surface of the substrate, wherein the photosensitive layer pattern comprises a first pattern located in the sensor area, a second pattern located in the non-sensor area, and a third pattern located in the wiring area; forming gaps in the first pattern and the third pattern; forming a metal layer on the photosensitive layer pattern; and forming a sensing pattern in the sensor area and a wiring line in the wiring area by removing the second pattern and a portion of the metal layer located on the second pattern.

In some embodiments, a second height measured from the surface of the substrate to a top surface of the second pattern may be greater than each of a first height measured from the surface of the substrate to a top surface of the first pattern and a third height measured from the surface of the substrate to a top surface of the third pattern.

In some embodiments, forming the photosensitive layer pattern on the surface of the substrate may include: forming a photosensitive layer by coating a photosensitive resin on the surface of the substrate; and exposing and developing the photosensitive layer using a mask, wherein the mask may include a first semi-transmitting mask pattern corresponding to the sensor area, a second semi-transmitting mask pattern corresponding to the wiring area, and a mask pattern corresponding to the non-sensor area.

In some embodiments, the photosensitive resin may be a positive photosensitive resin and the mask pattern may be a light-blocking pattern.

In some embodiments, the metal layer may include any one of molybdenum (Mo), silver (Ag), titanium (Ti), aluminum (Al), copper (Cu), gold (Au), platinum (Pt), and nickel (Ni), or an alloy thereof.

BRIEF DESCRIPTION OF THE DRAWINGS

The above and other aspects and features of the inventive concept will be more apparent when exemplary embodiments of the inventive concept are described with reference to the attached drawings.

DETAILED DESCRIPTION

Figure 1:
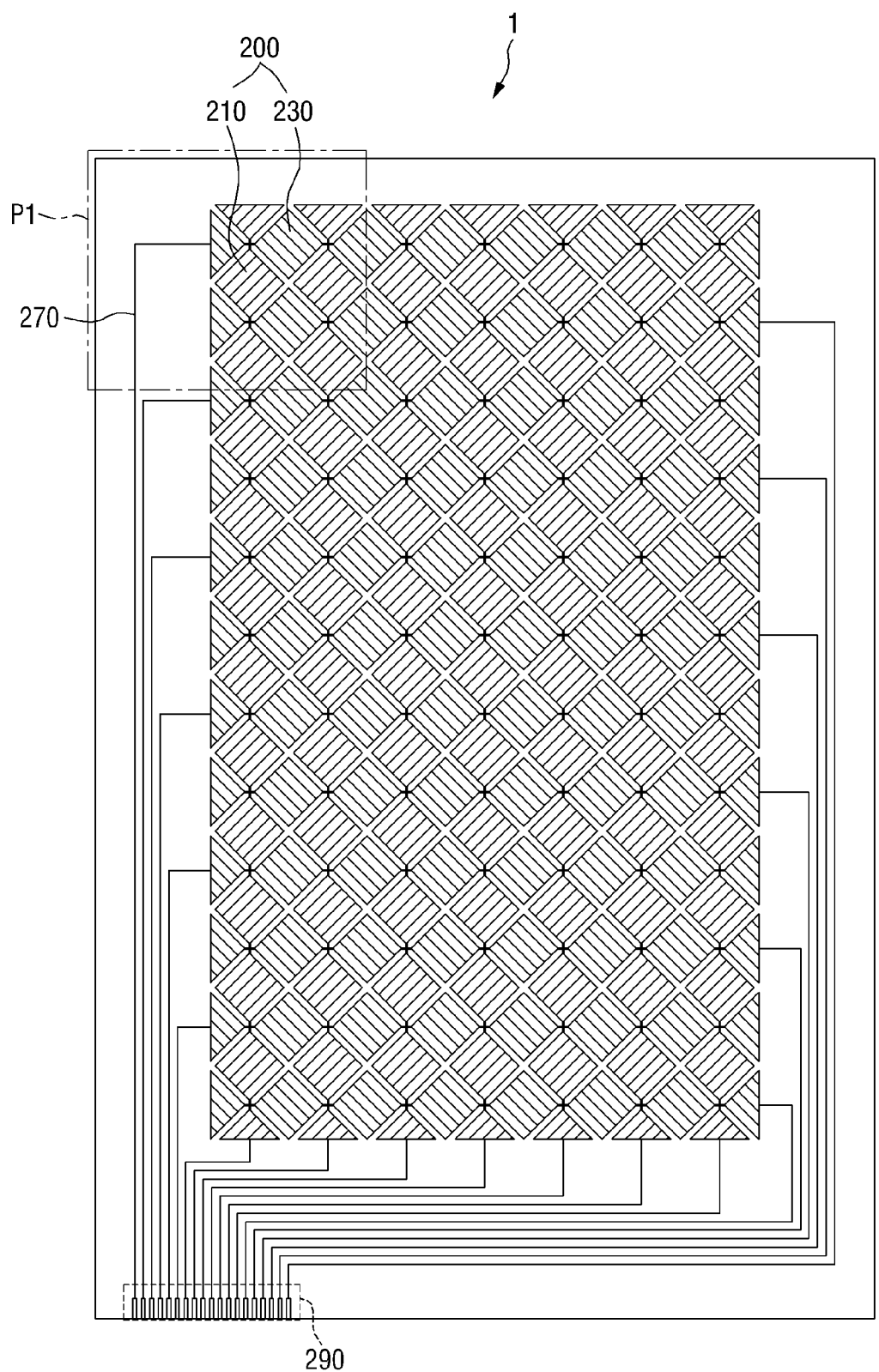
FIG. 1 is a schematic plan view of a touch panel according to an embodiment.

Advantages and features of the inventive concept and methods of accomplishing the same may be understood more readily with reference to the following detailed description of certain embodiments and the accompanying drawings. The inventive concept may, however, be embodied in many different forms and should not be construed as being limited to the embodiments set forth herein. Rather, these embodiments are provided so that this disclosure is thorough and complete and fully convey the concept of the inventive concept to those skilled in the art. Like reference numerals refer to like elements throughout the specification.

The terminology used herein is for describing the embodiments and should not be construed in a limiting manner. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to", or "coupled to" another element or layer, it can be directly on, connected, or coupled to the other element or layer, or with one or more intervening elements or layers being present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by those terms. Those terms are merely used to distinguish one element, component, region, layer, or section from another region, layer, or section. Thus, a first element, component, region, layer, or section described below could be termed a second element, component, region, layer, or section without departing from the teachings of the inventive concept.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as being limited to the particular shapes of regions illustrated herein but are to include deviations in shapes that may result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and this specification, and should not be interpreted in an idealized or overly formal sense unless expressly so defined herein.

Figure 2:
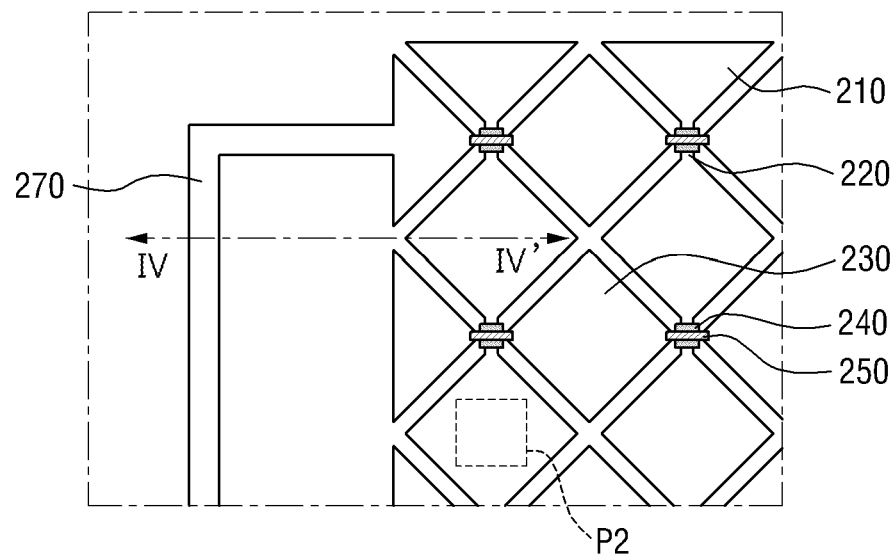
FIG. 2 is an enlarged plan view of portion P1 of FIG. 1.
Figure 3:
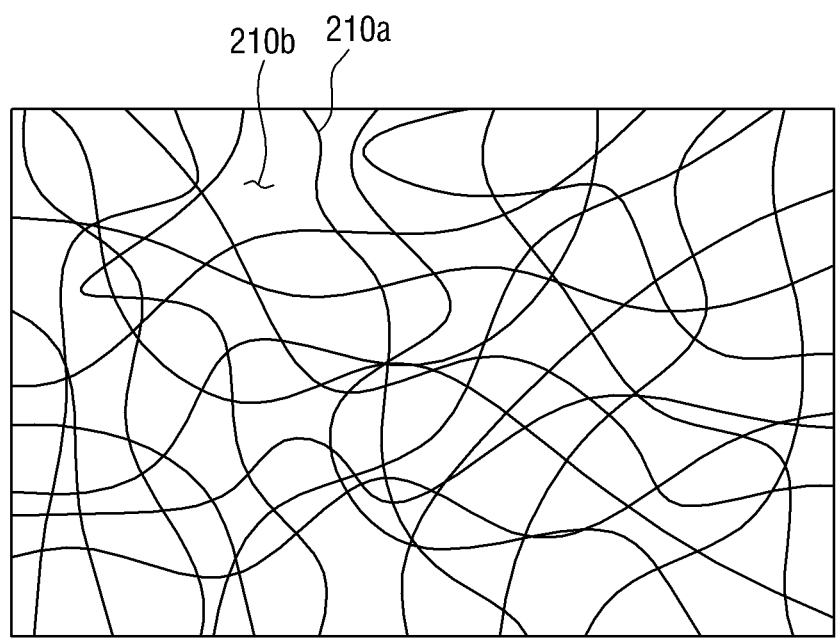
FIG. 3 is an enlarged plan view of portion P2 of FIG. 2.
Figure 4:
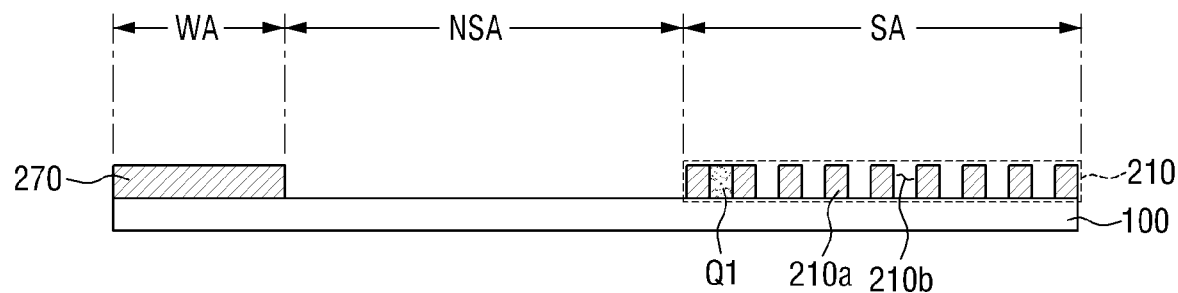
FIG. 4 is a cross-sectional view of the touch panel of FIG. 2 taken along line IV-IV'.

FIG. 1 is a schematic plan view of a touch panel according to an embodiment. FIG. 2 is an enlarged plan view of portion P1 of FIG. 1. FIG. 3 is an enlarged plan view of portion P2 of FIG. 2. FIG. 4 is a cross-sectional view of the touch panel of FIG. 2 taken along line IV-IV'.

Referring to FIGS. 1 through 4, a touch panel 1 according to an embodiment may include a substrate 100, a plurality of sensing patterns 200, and a plurality of wiring lines 270. In some embodiments, the touch panel 1 may further include one or more first connectors 220, insulating layer patterns 240, one or more second connectors 250, and a pad unit 290.

The substrate 100 is a transparent substrate having a surface on which the sensing patterns 200 and the wiring lines 270 are placed. The substrate 100 may be made of an insulating material such as glass, plastic, silicon or synthetic resin. In some embodiments, the substrate 100 may be a flexible film.

The substrate 100 may include a sensor area SA, a wiring area WA, and a non-sensor area NSA, as illustrated in FIG. 4. The sensing patterns 200 are configured to sense a touch position of a hand or an object, and are located in the sensor area SA. Specifically, the sensing patterns 200 may be located on the surface of the substrate 100 in the sensor area SA. The first connectors 220, the insulating layer patterns 240, and the second connectors 250 may also be located in the sensor area SA.

The wiring lines 270 are electrically connected to the sensing patterns 200, and are located in the wiring area WA. The wiring area WA may be located on a periphery of the surface of the substrate 100. The pad unit 290 is connected to the wiring lines 270. The wiring lines 270 and the pad unit 290 may be located on the surface of the substrate 100 in the wiring area WA.

In some embodiments, a driver circuit board (not illustrated) configured to drive the touch panel 1 may be electrically connected to the pad unit 290.

The non-sensor area NSA may be defined as an area excluding the sensor area SA and the wiring area WA. The sensing patterns 200, the first connectors 220, the second connectors 250, and the wiring lines 270 are not located in the non-sensor area NSA.

The sensing patterns 200 may be located on the surface of the substrate 100 in the sensor area SA. In an exemplary embodiment, the sensing patterns 200 may include a plurality of first sensing patterns 210 arranged in a first direction and a plurality of second sensing patterns 230 arranged in a second direction intersecting the first direction. The first direction and the second direction may be oblique to each other, as illustrated in FIG. 1.

The first sensing patterns 210 and the second sensing patterns 230 may be located at a same level. When the first and second sensing patterns 210 and 230 are located at the same level, it means that the first and second sensing patterns 210 and 230 are co-located in a same layer. In some embodiments, the first sensing patterns 210 and the second sensing patterns 230 may be formed directly on the surface of the substrate 100.

The first sensing patterns 210 and the second sensing patterns 230 may be made of a conductive material. The conductive material may be a metal material with low resistivity. Accordingly, the conductive material may reduce the resistance between the sensing patterns 200 or the resistance between the sensing patterns 200 and the wiring lines 270, thereby improving detection sensitivity. In some embodiments, the conductive material may include, but is not limited to, any one of molybdenum (Mo), silver (Ag), titanium (Ti), aluminum (Al), copper (Cu), gold (Au), platinum (Pt), and nickel (Ni), or an alloy of any of the above metals.

In some embodiments, the first sensing patterns 210 and the second sensing patterns 230 may be made of a same material in a same process.

Each of the first and second sensing patterns 210 and 230 may include a plurality of first fine metal lines arranged irregularly to form a mesh.

For example, referring to FIG. 3, a first sensing pattern 210 may include a plurality of first fine metal lines 210a arranged irregularly in a mesh and spaces 210b located between the first fine metal lines 210a.

Since each of the first and second sensing patterns 210 and 230 comprises a mesh of the first fine metal lines 210a, the shapes of the sensing patterns 200 will not be visible due to a difference in transmittance between an area with the sensing patterns 200 and an area without the sensing patterns 200. In addition, the light transmittance of the touch panel 1 can be improved by using the mesh of first fine metal lines 210a for the first and second sensing patterns 210 and 230.

In some embodiments, a photosensitive layer pattern residue Q1 may be located in some of the spaces 210b between the first fine metal lines 210a. The photosensitive layer pattern residue Q1 may be made of a photosensitive resin. In an exemplary embodiment, the photosensitive resin may be a positive photosensitive resin. However, the inventive concept is not limited thereto. In another embodiment, the photosensitive resin may be a negative photosensitive resin.

Adjacent first sensing patterns 210 arranged along the first direction may be connected to each other by the first connectors 220 located on the surface of the substrate 100.

The first connectors 220 may be located on the surface of the substrate 100 in the sensor area SA. In some embodiments, the first connectors 220 may be located at the same level as the first sensing patterns 210 and the second sensing patterns 230, and formed directly on the surface of the substrate 100.

Similar to the first sensing patterns 210 and the second sensing patterns 230, the first connectors 220 may also be made of a conductive material. In some embodiments, the first connectors 220 may be made of the same material as the first sensing patterns 210 and the second sensing patterns 230, and may be formed in the same process as the first sensing patterns 210 and the second sensing patterns 230. In some embodiments, the first connectors 220 may be formed integrally with the first sensing patterns 210.

In some embodiments, each of the first connectors 220 may include a mesh of fine metal lines similar to those in the first sensing patterns 210 and the second sensing patterns 230. For example, each of the first connectors 220 may include a plurality of fine metal lines arranged irregularly in a mesh.

The insulating layer patterns 240 may be located on the first connectors 220 covering the first connectors 220. In some embodiments, the insulating layer patterns 240 may completely cover the first connectors 220. In some embodiments, the insulating layer patterns 240 may be made of, but is not limited to, an organic insulating material.

The second connectors 250 may be located on the insulating layer patterns 240 intersecting the first connectors 220. The second connectors 250 may electrically connect adjacent second sensing lines 230 arranged along the second direction.

The second connectors 250 may be made of a conductive material, and the conductive material may be a metal material with low resistivity. Examples of the conductive material are the same as those described above in the description of the first sensing patterns 210 and the second sensing patterns 230, and thus a detailed description thereof is omitted.

The wiring lines 270 may be located on the surface of the substrate 100 in the wiring area WA. The wiring lines 270 may be electrically connected to the first sensing patterns 210 and the second sensing patterns 230. In some embodiments, the wiring lines 270 may be directly connected to at least one of the sensing patterns 200 located on an outermost edge of the sensor area SA.

The wiring lines 270 may be located at the same level as the first sensing patterns 210 and the second sensing patterns 230. In some embodiments, the wiring lines 270 may be formed directly on the surface of the substrate 100. The wiring lines 270 may be made of a conductive material, and the conductive material may be a metal material with low resistivity. Examples of the conductive material are the same as those described above in the description of the first sensing patterns 210 and the second sensing patterns 230, and thus a detailed description thereof is omitted.

In some embodiments, the wiring lines 270 may be made of the same material as the first sensing patterns 210 and the second sensing patterns 230 in the same process.

Next, a method of manufacturing the touch panel 1 will be described.

FIGS. 5, 6, 7, 8, and 9 are cross-sectional views of the touch panel 1 of FIG. 4 at different stages of manufacture according to an exemplary method of manufacturing the touch panel.

Figure 5:
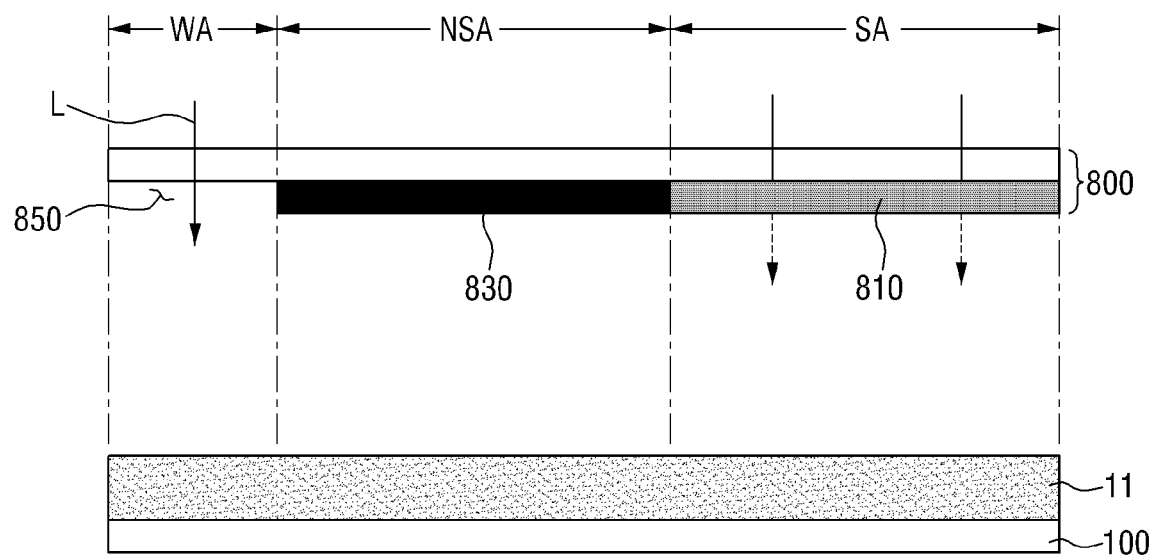
FIGS. 5, 6, 7, 8, and 9 are cross-sectional views of the touch panel of FIG. 4 at different stages of manufacture according to an exemplary method of manufacturing the touch panel.

Referring to FIGS. 5 through 9, a substrate 100 having a defined sensor area SA, a non-sensor area NSA, and a wiring area WA, is provided. As shown in FIG. 5, a photosensitive layer 11 is formed on a surface of the substrate 100. The photosensitive layer 11 may be formed by spreading or coating a liquid photosensitive resin. The photosensitive layer 11 may be a positive photosensitive layer whereby its exposed portion can be removed by development. However, the inventive concept is not limited thereto. In some other embodiments, the photosensitive layer 11 may be a negative photosensitive layer whereby its unexposed portion can be removed by development.

After the photosensitive layer 11 is formed, a mask 800 is placed above the surface of the substrate 100. The mask 800 may include a semi-transmitting mask pattern 810 corresponding to the sensor area SA, a first mask pattern 830 corresponding to the non-sensor area NSA, and a second mask pattern 850 corresponding to the wiring area WA. The semi-transmitting mask pattern 810 may be a halftone pattern or a slit pattern. If the photosensitive layer 11 is a positive photosensitive layer, the first mask pattern 830 may be a light-blocking pattern, and the second mask pattern 850 may be a light-transmitting pattern. For ease of description, an embodiment in which the photosensitive layer 11 is a positive photosensitive layer will be described herein as an example. However, the inventive concept is not limited thereto. In another embodiment, if the photosensitive layer 11 is a negative photosensitive layer, the first mask pattern 830 may be a light-transmitting pattern, and the second mask pattern 850 may be a light-blocking pattern.

The photosensitive layer 11 is exposed to light by irradiating ultraviolet (UV) light L (from above the substrate 100) to the substrate 100. A portion of the photosensitive layer 11 located on the surface of the substrate 100 in the wiring area WA is fully exposed, whereas a portion of the photosensitive layer 11 located on the surface of the substrate 100 in the sensor area SA is partially exposed. In contrast, a portion of the photosensitive layer 11 located on the surface of the substrate 100 in the non-sensor area NSA is not exposed.

Figure 6:
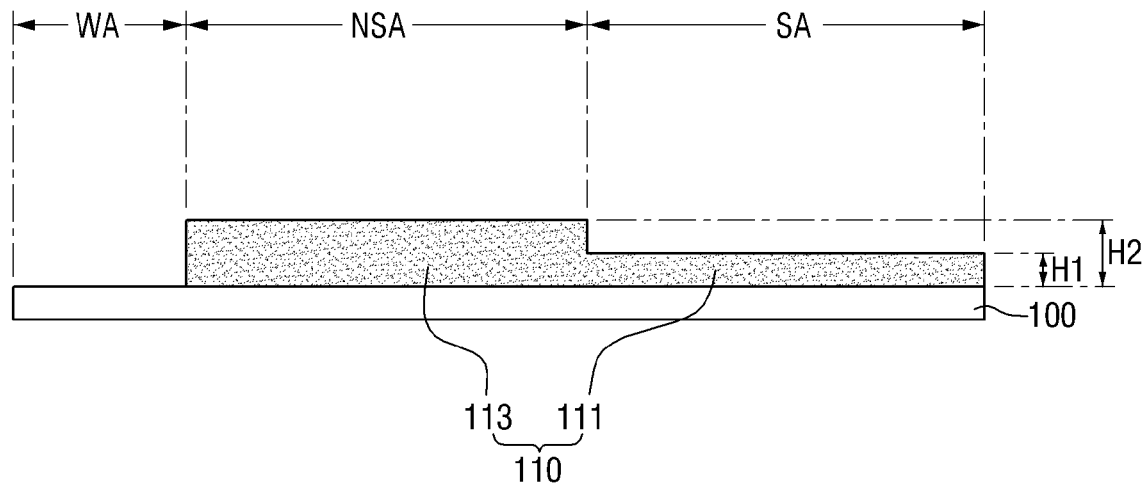

The exposed portions of the photosensitive layer 11 are removed by a development process. As a result, a photosensitive layer pattern 110 including a first pattern 111 located in the sensor area SA and a second pattern 113 located in the non-sensor area NSA, is formed as illustrated in FIG. 6. As shown in FIG. 6, the photosensitive layer pattern 110 is not formed in the wiring area WA.

A thickness of the first pattern 111 may be less than a thickness of the second pattern 113. For example, a height H1 (measured from the surface of the substrate 100 to a top surface of the first pattern 111) may be less than a height H2 (measured from the surface of the substrate 100 to a top surface of the second pattern 113).

Figure 7:
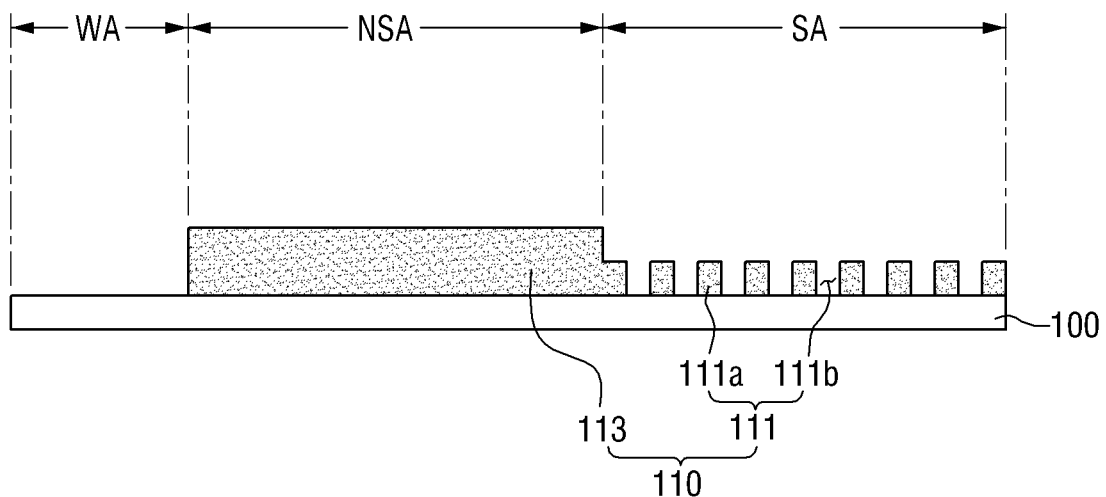

Next, the photosensitive layer pattern 110 is dried, thereby forming gaps 111*b* in the first pattern 111, as illustrated in FIG. 7. In other words, the dried first pattern 111 includes the gaps 111*b* and remaining patterns 111*a* between the gaps 111*b*. To form the gaps 111*b*, heat may be applied to the photosensitive layer pattern 110, and physical impact (such as vibrations) may also be applied to the photosensitive layer pattern 110. In addition, a chemical treatment process using an etchant may be performed to form the gaps 111*b*. In some embodiments, the density and interval between the gaps 111*b* may be adjusted by controlling the temperature and duration of the heat treatment that is applied to the photosensitive layer pattern 110.

Figure 8:
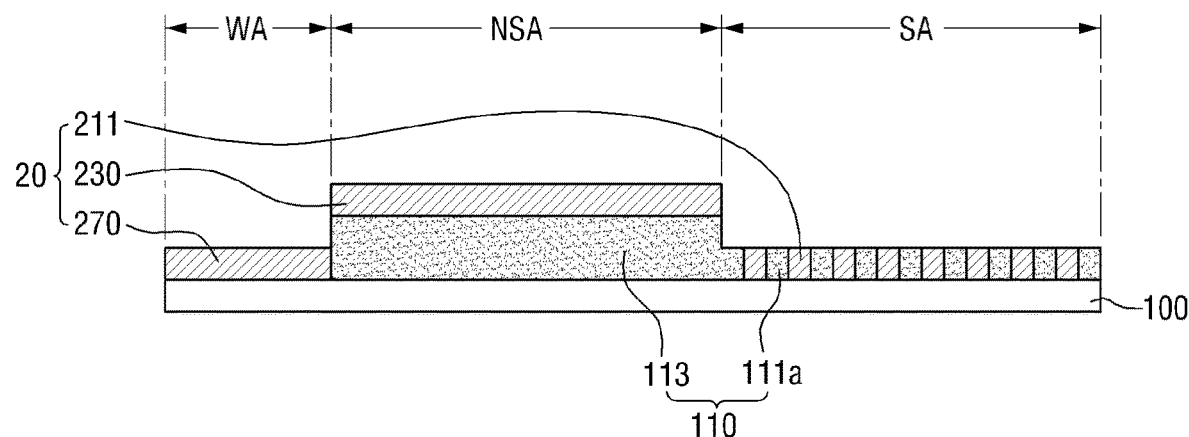

Referring to FIG. 8, a metal layer 20 is formed on the surface of the substrate 100 and the photosensitive layer pattern 110. The metal layer 20 may be formed by sputtering, evaporation, an electrochemical solution process, electroplating, etc.

A portion of the metal layer 20 is deposited on the first pattern 111 and fills the gaps 111*b* to form a plurality of first fine metal lines 210*a*. A portion of the metal layer 20 is deposited on the wiring area WA of the substrate 100 to form wiring lines 270. Since the metal layer 20 is formed over the entire surface of the substrate 100, a portion 230 of the metal layer 20 may be formed on the second pattern 113.

Figure 9:
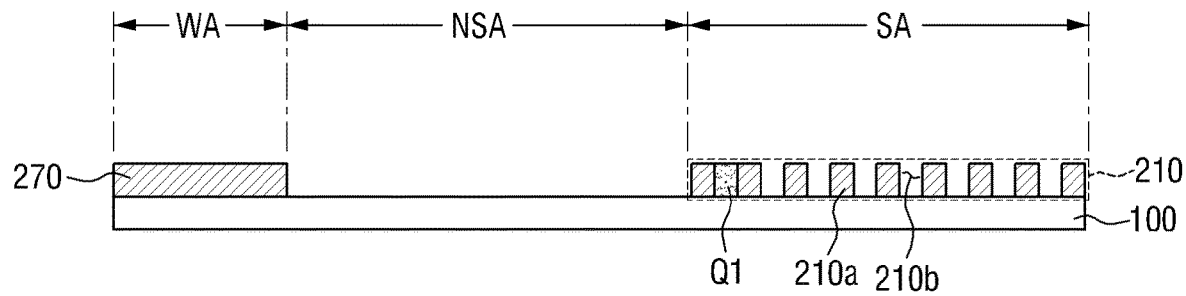

When the first and second patterns 111 and 113 of the photosensitive layer pattern 110 are removed, the portion 230 of the metal layer 20 located on the second pattern 113 will be removed via a "lift-off" process. Accordingly, a touch panel including a wiring line 270 located on the surface of the substrate 100 in the wiring area WA and a sensing pattern 210 located on the surface of the substrate 100 in the sensor area SA is formed, as illustrated in FIG. 9. The sensing pattern 210 includes a mesh of the first fine metal lines 210*a* previously described with reference to FIGS. 1 through 4.

As shown in FIG. 9, spaces 210*b* are formed between the first fine metal lines 210*a*. In some instances, some of the remaining patterns 111*a* may not be completely removed and may remain in some of the spaces 210*b*. That is, the touch panel according to the above-described embodiment may have a photosensitive layer pattern residue Q1 remaining in some of the spaces 210*b*.

In some embodiments (not shown), the exemplary method described in FIGS. 5 through 9 may further include forming an insulating layer pattern 240 (see, e.g., FIG. 4) and forming a second connector 250 (see, e.g., FIG. 2).

Using the exemplary method described in FIGS. 5 through 9, a mesh of sensing patterns can be formed. In addition, since sensing patterns and wiring lines can be formed simultaneously, the manufacturing process for the touch panel can be further simplified.

Figure 10:
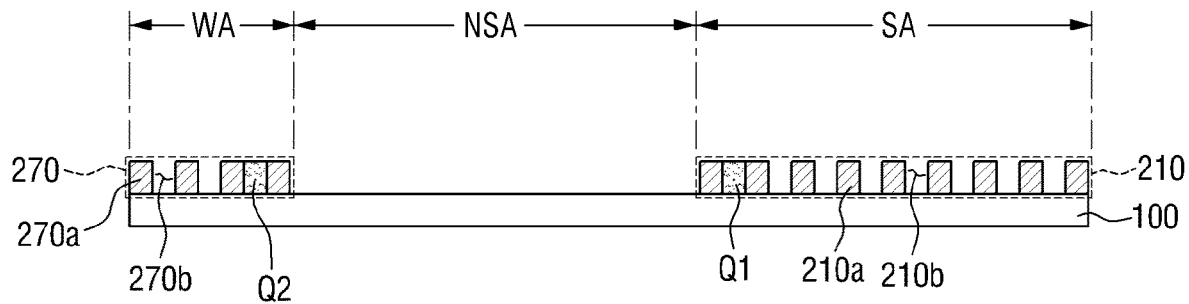
FIG. 10 is a cross-sectional view of a touch panel according to another embodiment.

FIG. 10 is a cross-sectional view of a touch panel according to another embodiment. The touch panel of FIG. 10 is similar to the touch panel of FIG. 4 except for the structure of the wiring line. A repeated description of those similar elements will be omitted, and the following description shall focus on the differences between the embodiments of FIGS. 4 and 10.

Referring to FIG. 10, a wiring line 270 may include a plurality of second fine metal lines 270*a* arranged irregularly to form a mesh and spaces 270*b* located between the second fine metal lines 270*a*.

In some embodiments, a photosensitive layer pattern residue Q2 may be located in some of the spaces 270*b* between the second fine metal lines 270*a*. The photosensitive layer pattern residue Q2 may be made of a photosensitive resin. In an exemplary embodiment, the photosensitive resin may be a positive photosensitive resin. However, the inventive concept is not limited thereto. In another embodiment, the photosensitive resin may be a negative photosensitive resin. A photosensitive layer pattern residue Q1 may be located in a sensor area SA. The photosensitive layer pattern residue Q2 located in a wiring area WA may be made of the same material as the photosensitive layer pattern residue Q1 located in the sensor area SA.

FIGS. 11, 12, 13, 14, and 15 are cross-sectional views of the touch panel of FIG. 10 at different stages of manufacture according to an exemplary method of manufacturing the touch panel.

Figure 11:
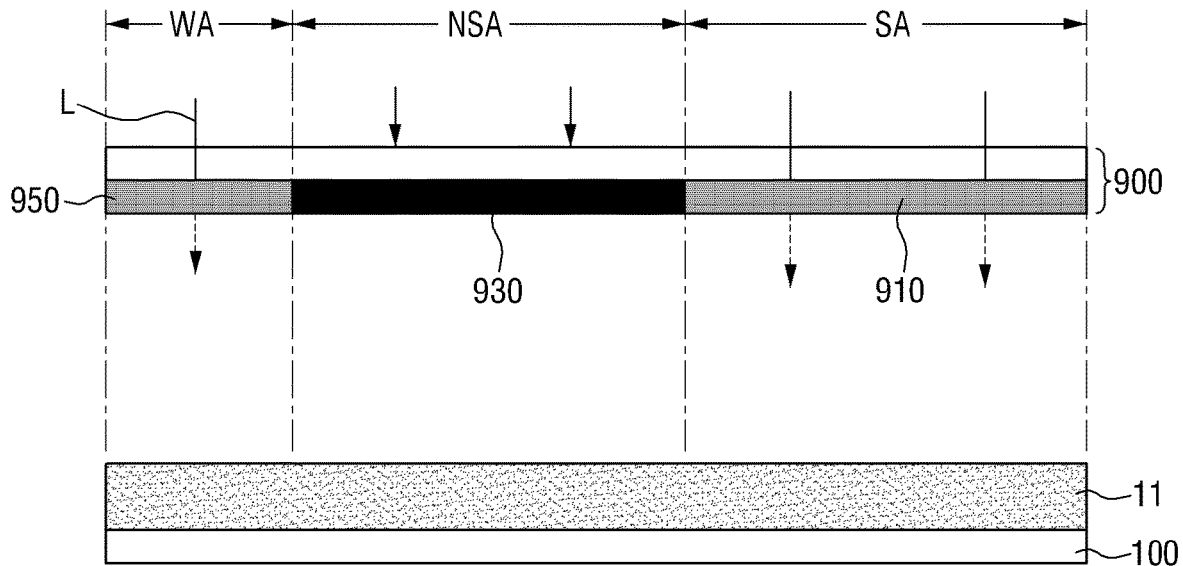
FIGS. 11, 12, 13, 14, and 15 are cross-sectional views of the touch panel of FIG. 10 at different stages of manufacture according to an exemplary method of manufacturing the touch panel.

Referring to FIGS. 11 through 15, a substrate 100 having a defined sensor area SA, a non-sensor area NSA, and a wiring area WA, is provided. As shown in FIG. 11, a photosensitive layer 11 is formed on a surface of the substrate 100. The photosensitive layer 11 may be formed by spreading or coating a liquid photosensitive resin. The photosensitive layer 11 may be a positive photosensitive layer, but the inventive concept is not limited thereto. As previously described with reference to FIGS. 4 through 9, the photosensitive layer 11 may be a negative photosensitive layer in some other embodiments.

After the photosensitive layer 11 is formed, a mask 900 is placed above the surface of the substrate 100. The mask 900 may include a first semi-transmitting mask pattern 910 corresponding to the sensor area SA, a mask pattern 930 corresponding to the non-sensor area NSA, and a second semi-transmitting mask pattern 950 corresponding to the wiring area WA. Each of the first semi-transmitting mask pattern 910 and the second semi-transmitting mask pattern 950 may be a halftone pattern or a slit pattern.

If the photosensitive layer 11 is a positive photosensitive layer, the mask pattern 930 may be a light-blocking pattern. For ease of description, an embodiment in which the photosensitive layer 11 is a positive photosensitive layer will be herein described as an example. However, the inventive concept is not limited thereto. In another embodiment, if the photosensitive layer 11 is a negative photosensitive layer, the mask pattern 930 may be a light-transmitting pattern.

The photosensitive layer 11 is exposed to light by irradiating UV light L to the substrate 100 (from above the substrate 100). A portion of the photosensitive layer 11 located on the surface of the substrate 100 in the wiring area WA and a portion of the photosensitive layer 11 located on the surface of the substrate 100 in the sensor area SA are partially exposed. In addition, a portion of the photosensitive layer 11 located on the surface of the substrate 100 in the non-sensor area NSA is not exposed.

Figure 12:
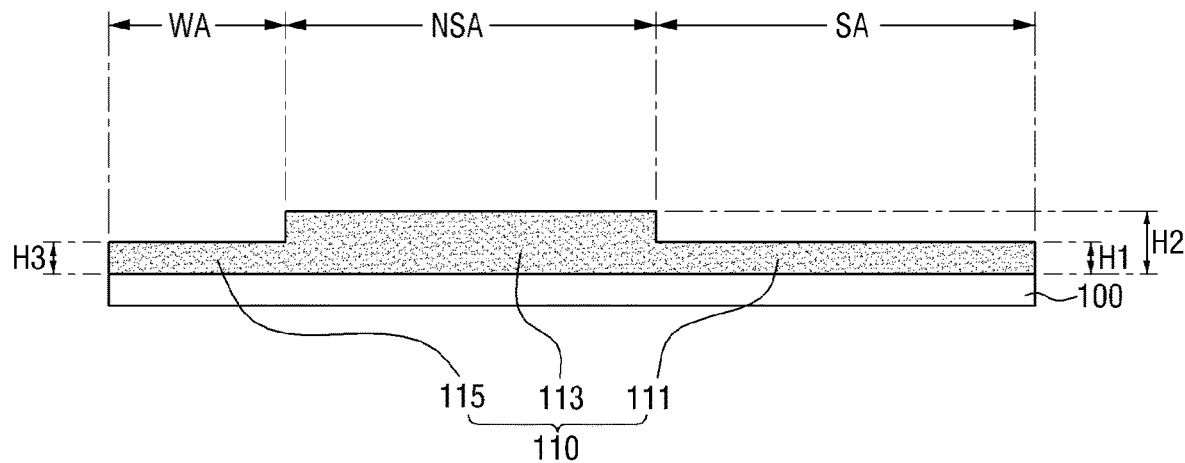

The exposed portions of the photosensitive layer 11 are removed by a development process. As a result, a photosensitive layer pattern 110 including a first pattern 111 located in the sensor area SA, a second pattern 113 located in the non-sensor area NSA, and a third pattern 115 located in the wiring area WA, is formed as illustrated in FIG. 12.

A thickness of the first pattern 111 may be less than a thickness of the second pattern 113. For example, a height H1 (measured from the surface of the substrate 100 to a top surface of the first pattern 111) may be less than a height H2 (measured from the surface of the substrate 100 to a top surface of the second pattern 113).

In addition, a thickness of the third pattern 115 may be less than a thickness of the second pattern 113. For example, a height H3 (measured from the surface of the substrate 100 to a top surface of the third pattern 115) may be less than the height H2 (measured from the surface of the substrate 100 to the top surface of the second pattern 113).

Figure 13:
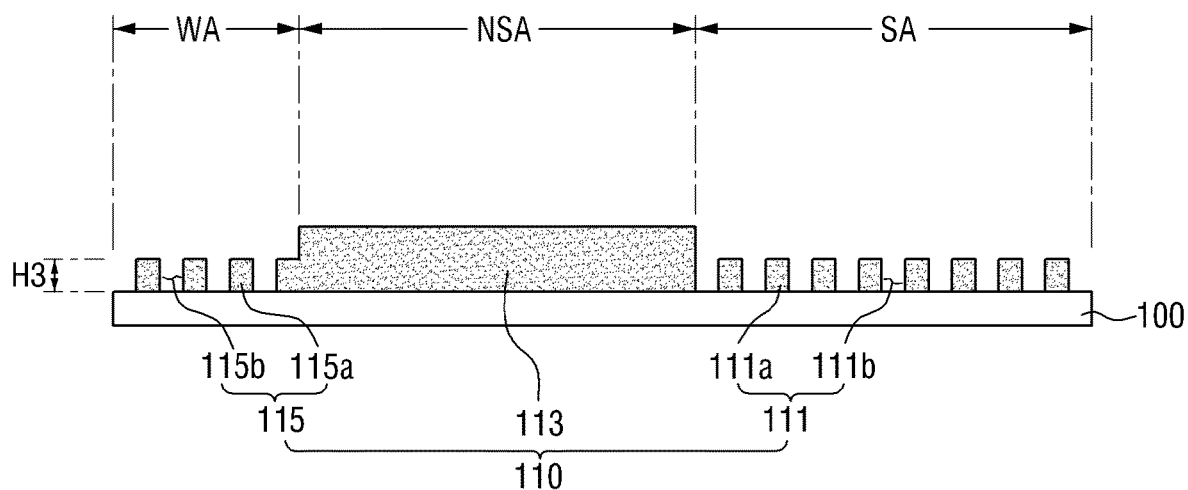

Next, the photosensitive layer pattern 110 is dried, thereby forming gaps 111b in the first pattern 111 and gaps 115b in the third pattern 115, as illustrated in FIG. 13. In other words, the dried first pattern 111 includes the gaps 111b and remaining patterns 111a between the gaps 111b, and the third pattern 115 includes the gaps 115b and remaining patterns 115a between the gaps 115b. To form the gaps 111b and 115b, heat may be applied to the photosensitive layer pattern 110, and physical impact (such as vibrations) may be applied to the photosensitive layer pattern 110. In addition, a chemical treatment process using an etchant may be performed to form the gaps 111b and 115b. In some embodiments, the density and interval between the gaps 111b and 115b may be adjusted by controlling the temperature and duration of the heat treatment that is applied to the photosensitive layer pattern 110.

Figure 14:
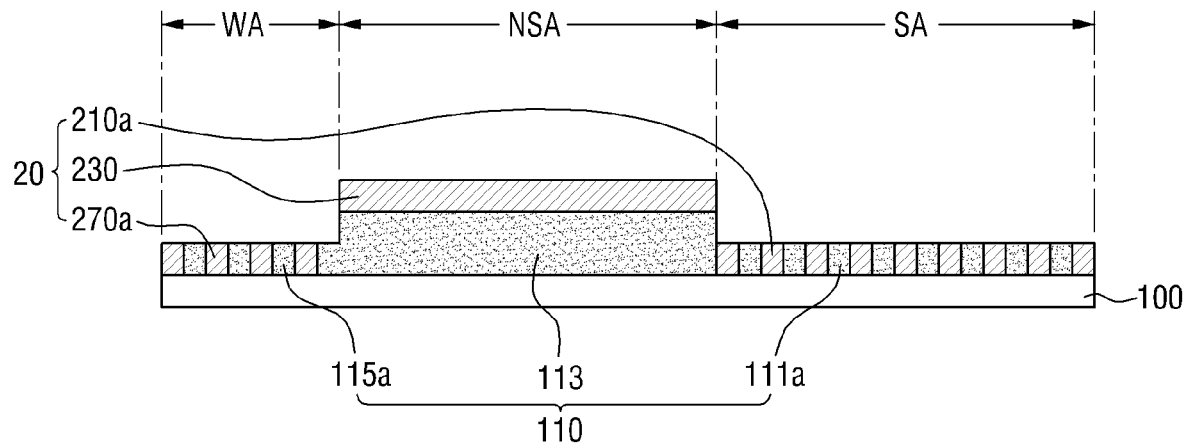

Referring to FIG. 14, a metal layer 20 is formed on the surface of the substrate 100 and the photosensitive layer pattern 110.

A portion of the metal layer 20 is deposited on the first pattern 111 and fills the gaps 111b to form a plurality of first fine metal lines 210a. Also, a portion of the metal layer 20 is deposited on the third pattern 115 and fills the gaps 115b to form a plurality of second fine metal lines 270a. Since the metal layer 20 is formed over the entire surface of the substrate 100, a portion 230 of the metal layer 20 is formed on the second pattern 113.

Figure 15:
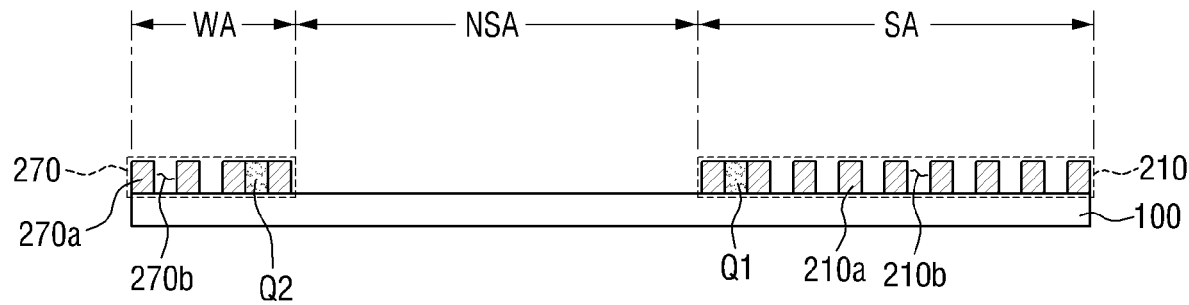

When the first, second, and third patterns 111, 113, and 115 of the photosensitive layer pattern 110 are removed, the portion 230 of the metal layer 20 located on the second pattern 113 will be removed via a "lift-off" process. Accordingly, a touch panel including a wiring line 270 located on the surface of the substrate 100 in the wiring area WA and a sensing pattern 210 located on the surface of the substrate 100 in the sensor area SA, is formed as illustrated in FIG. 15. The sensing pattern 210 includes a mesh of the first fine metal lines 210 previously described with reference to FIGS. 1 through 4. Also, the wiring line 270 includes a mesh of the second fine metal lines 270a previously described with reference to FIG. 10.

As shown in FIG. 15, spaces 210b are formed between the first fine metal lines 210a. In some instances, some of the remaining patterns 111a may not be completely removed and may remain in some of the spaces 210b. Specifically, part of the first pattern 111 may remain in some of the spaces 210b as a photosensitive layer pattern residue Q1.

Likewise, spaces 270b are formed between the second fine metal lines 270a. In some instances, some of the remaining patterns 115a may not be completely removed and may remain in some of the spaces 270b. Specifically, part of the third pattern 115 may remain in some of the spaces 270b as a photosensitive layer pattern residue Q2.

In some embodiments (not shown), the exemplary method described in FIGS. 5 through 9 may further include forming an insulating layer pattern 240 (see, e.g., FIG. 4) and forming a second connector 250 (see, e.g., FIG. 2).

A touch panel having improved detection sensitivity and transmittance, and a method of manufacturing the touch panel, are disclosed in the above embodiments.

While the inventive concept has been described with reference to exemplary embodiments, it will be understood by one of ordinary skill in the art that various changes may be made to the embodiments without departing from the spirit and scope of the inventive concept.

What is claimed is:
1. A touch sensor comprising:
    a substrate comprising a wiring area and a sensor area;
    a plurality of sensing patterns located on the substrate in the sensor area and arranged in a regular pattern; and a wiring line located on the substrate in the wiring area and electrically connected to the plurality of sensing patterns, wherein each of the plurality of sensing patterns comprises a plurality of first fine metal lines arranged within a corresponding sensing pattern in a mesh pattern when viewed in a plan view of the touch sensor, and a first photosensitive layer pattern residue located between at least two of the first fine metal lines, wherein an entirety of the first photosensitive layer pattern residue is made of a photosensitive resin, wherein the plurality of first fine metal lines are made of a same material, and wherein the plurality of first fine metal lines and the first photosensitive layer pattern residue are both disposed directly on a same layer.

2. The touch sensor of claim 1, wherein the wiring line includes the same material.

3. The touch sensor of claim 2, wherein each of the plurality of sensing patterns and the wiring line comprises any one of molybdenum (Mo), silver (Ag), titanium (Ti), aluminum (Al), copper (Cu), gold (Au), platinum (Pt), and nickel (Ni), or an alloy thereof.

4. The touch sensor of claim 1, wherein the first photosensitive layer pattern residue is made of a positive photosensitive resin.

5. The touch sensor of claim 1, wherein the wiring line comprises a plurality of second fine metal lines arranged in a mesh pattern, and a second photosensitive layer pattern residue located between at least two of the second fine metal lines.

6. The touch sensor of claim 1, wherein the substrate is a transparent substrate.

7. The touch sensor of claim 1, wherein the substrate is made of an insulating material selected from a group comprising glass, plastic, silicon and synthetic resin.

8. The touch sensor of claim 1, wherein the substrate is made of a flexible film.

9. The touch sensor of claim 1, wherein the substrate further comprises a non-sensor area, and none of the plurality of sensing patterns and the wiring line is located in the non-sensor area.

10. The touch sensor of claim 1, wherein the plurality of sensing patterns comprises a plurality of first sensing patterns extending in a first direction and a plurality of second sensing patterns extending in a second direction that is different from the first direction.

* * * * *